United States Patent [19]

Matsuda et al.

[11] Patent Number: 4,811,304
[45] Date of Patent: Mar. 7, 1989

[54] MDS DECODER CIRCUIT WITH HIGH VOLTAGE SUPPRESSION OF A DECOUPLING TRANSISTOR

[75] Inventors: Yoshio Matsuda; Hideshi Miyatake; Kazuyasu Fujishima, all of Itami, Japan

[73] Assignee: Mitsubishi Denki Kabushiki Kaisha, Tokyo, Japan

[21] Appl. No.: 838,303

[22] Filed: Mar. 10, 1986

[30] Foreign Application Priority Data

Jun. 20, 1985 [JP] Japan ................................. 60-135334

[51] Int. Cl.⁴ ........................ G11C 8/00; G11C 80/00; H03K 19/094; H03K 19/20
[52] U.S. Cl. ................................... 365/233; 365/230; 307/449
[58] Field of Search ....................... 365/230, 233, 189; 307/449, 463

[56] References Cited

U.S. PATENT DOCUMENTS 4,289,982  9/1981  Smith .................................. 365/230
4,417,329 11/1983  Mezawa et al. ................. 365/203 X
4,490,628 12/1984  Ogura ................................... 307/449

FOREIGN PATENT DOCUMENTS 56-94661   7/1981  Japan ................................... 307/449
58-212226 12/1983  Japan ................................... 307/449
59-9990    3/1984  Japan ................................... 365/189

OTHER PUBLICATIONS

"A 90 ns 1 Mb DRAM with Multi-Bit Test Mode", Masaki Kaumanoya et al., '85 IEEE International Solid-State Circuits Conference Digest of Technical Papers, pp. 240-241, p. 352.

Primary Examiner—Stuart N. Hecker
Assistant Examiner—Alfonso Garcia
Attorney, Agent, or Firm—Lowe Price LeBlanc Becker & Shur

[57] ABSTRACT

A dynamic random access memory device having common signal lines to transmit row address signals and column address signals, uses change-over switches to transfer those signals to a row decoder. Voltage suppression circuitry limits high voltage applied to decoupling transistors provided at decoder outputs. An MOS transistor used as a voltage suppression device between the decoupling transistor and a word line activating transistor transfers word line activating signals.

6 Claims, 3 Drawing Sheets

MDS DECODER CIRCUIT WITH HIGH VOLTAGE SUPPRESSION OF A DECOUPLING TRANSISTOR

DESCRIPTION OF THE INVENTION

1. Field of the Invention

The present invention relates to a semiconductor integrated circuit device. More specifically, the present invention relates to a semiconductor integrated circuit device including an MOS dynamic RAM (random access memory), constituted to transmit row address signals and column address signals using common signal lines, and transferring them to a row decoder and column decoder, wherein a high voltage applied to a decoupling transistor provided at an output portion of a decoder is relaxed.

2. Description of the Prior Art

FIG. 1 is a circuit diagram showing a conventional decoder circuit in an MOS dynamic RAM, constituted to transmit row address signals and column address signals using common signal lines, to transfer them to a row decoder and a column decoder, by selecting the row or the column decoder with change-over switches, respectively. The constitution and operation at the output portion of the row decoder circuit is described with reference to FIG. 1.

The row decoder circuit portion for selecting a word line, described first, comprises a row decoder 3 which receives and decodes a plurality of address signals $A1 \sim An$, $\overline{A1} \sim \overline{An}$ transmitted through address signal lines $1\text{-}1 \sim 1\text{-}n$, a precharge transistor 4 which is turned on and off in synchronization with a row address strobe signal $\overline{RAS}$ and precharges an output signal line of the row decoder 3, a decoupling transistor 8 which is provided at the output signal line of the decoder 3 and is turned on and off responding to an $\overline{RXD}$ signal to separate electrically the row decoder 3 from a word line 5, and a word driver transistor 6 which turns on and off in response to signals through the transistor 8 and transfers word line activating signals RX to the word line 5.

The row decoder 3 comprises a plurality of field effect transistors $2\text{-}1 \sim 2\text{-}n$ in which each gate electrode is connected to the corresponding address signal line $1\text{-}1 \sim 1\text{-}n$. Each drain electrode thereof is commonly connected to the output signal line, and each source electrode thereof is grounded. The precharge transistor 4 receives the $\overline{RAS}$ signal at its gate electrode. Its source electrode is coupled to the power voltage Vcc, and the drain electrode thereof is connected to the output signal line of the row decoder 3.

The decoupling transistor 8 receives the $\overline{RXD}$ signal at its gate electrode. Its source electrode is coupled to the drain electrode of the precharge transistor 4 through a node 11, and the drain electrode thereof is connected through a node 10 to the gate electrode of the word driver transistor 6.

The word driver transistor 6 receives the word line activating signal RX at one conducting terminal, and the other terminal is connected to the word line 5. A capacitance 7 shown by a broken line is the gate capacitance of the transistor 6, and a capacitance 9, shown by a broken line, is the stray capacitance of the interconnection between the drain electrode of the decoupling transistor 8 and the gate electrode of the word driver transistor 6.

The column decoder circuit portion includes a plurality of switching transistors $14\text{-}1 \sim 14\text{-}n$, and the column decoder 12. The switching transistors $14\text{-}1 \sim 14\text{-}n$ are connected to the respective address-signal lines $1\text{-}1 \sim 1\text{-}n$ through the respective signal lines $13\text{-}1 \sim 13\text{-}n$ for transmitting the column-address signals to the column decoder 12. The switching transistors $14\text{-}1 \sim 14\text{-}n$ are turned on and off receiving the address switching signal ADSW at each gate electrode to transfer the column-address signals to the column decoder 12 at the time of column selection. The column decoder 12 decodes the transferred column-address signals through the switching transistors $14\text{-}1 \sim 14\text{-}n$.

FIG. 2 shows a timing chart, indicating each signal timing in the circuit shown in FIG. 1. The operation in a conventional decoder circuit will be described with reference to FIGS. 1 and 2. First, the $\overline{RAS}$ signal, which is the basic signal to activate row selection, rises to an "H" level, whereby the precharge transistor 4 is turned on and the output-signal line of the row decoder 3 is electrically connected to the power supply (the voltage Vcc=5 V). At this moment, if the $\overline{RXD}$ signal reaches the "H" level, the decoupling transistor 8 is turned on, and the nodes 10 and 11 are charged through the transistor 4.

When the threshold voltages of the precharge transistor 4 and the decoupling transistor 8 are both set at 1 V, the potentials at the nodes 10 and 11 reach 4 V (the portions of the "H"-levels for the $\overline{RAS}$ and $\overline{RXD}$ signals are about 5 V). Then, the $\overline{RAS}$ signal falls to the "L" level to turn off the transistor 4, and the row decoder output portion is switched into the electrically floating state. Then, row-address signals $A1(\overline{A1}) \sim An(\overline{An})$ are transferred to the row-address decoder 3 through each address line $1\text{-}1 \sim 1\text{-}n$. If at least one of the transferred row-address signals is in the "H" level, the transistor which is connected to the address signal line inputted "H" signal is turned on, and the potentials at the nodes 10 and 11 are discharged through the on-state transistor to zero volts.

Only in the row decoder where all the transferred row address signals are in the "L" level, the potentials at the nodes 10 and 11 are retained at 4 V as they were before, and therefore, setting of the row decoder 3 is completed. Since the potential at the node 10 is 4 V, in this instance, the word driver transistor 6 is turned on, and the word line activating signal RX in the "H" level (the voltage is 5 V), which is subsequently inputted is transferred to the word line 5 through the transistor 6, and the potential on the word line 5 reaches 5 V. After that, the RXD signal falls to the "L" level to turn off the decoupling transistor 8. When the word activating signal RX in the "H" level is supplied, the potential at the node 10 rises and actually reaches about 8 V because of the capacitive coupling by the gate capacitance 7 in the word activating transistor 6. In this case, the stray capacitance 9 of the interconnection at the node 10 is taken into consideration.

Thereafter, the address switching signal ADSW rises, the switching transistors 14-1 14-n are turned on, and the column decoder 12 is connected to the signal line $13\text{-}1 \sim 13\text{-}n$. The subsequently inputted column address signals are transferred to the column decoder 12.

Since the column address signals are transferred through the signal lines $1\text{-}1 \sim 1\text{-}n$, they are also transferred to the gate electrodes of the transistors $2\text{-}1 \sim 2\text{-}n$. Generally, the column address signals are not coincident with the previously inputted row address signals, so that some of the transistors $2\text{-}1 \sim 2\text{-}n$ in the row decoder 3 selected at the word line selection are turned on and the potential at the node 11 is discharged through the transistors in the on-state to zero volt.

Finally, the potentials for the source (node 11), gate, and drain (node 10) of the decoupling transistor 8 for the selected row decoder are 0 V, 0 V, and 8 V, respectively. Namely, the high voltages of about 8 V are applied across the source and the drain electrodes and across the gate and the drain electrodes of the decoupling transistor 8.

Recently, there are inclinations where the potential for the word line is increased to a higher level. In this case, the potential for the word line activating signal RX is increased to about 7 V. Accordingly the potentials for the source, the gate and the drain electrodes of the decoupling transistor 8 at column selection become 0 V, 0 V, and 10 V, respectively. The high voltages, up to 10 V, are applied across the source and the drain electrodes, and across the gate and drain electrodes of the decoupling transistor 8.

Such high voltages, applied to the decoupling transistor 8, may cause some problems such as degradation, breakdown, or malfunction of the decoupling transistor, and resulting in significantly lowering the reliability of the device.

The prior art, wherein the word line potential is increased, is disclosed in Japanese Patent Publication 9990/1984.

However, since the device in said prior art is a type, wherein the potential for the row decoder is not discharged at the column selection, the decoupling transistor is not required, and the problems caused by the high voltage do not occur.

The device, wherein the potential for the row decoder is discharged, is disclosed in "A 90 ns 1 Mb DRAM with Multi-Bit Test Mode", M. Kumanoya et al., '85 IEEE International Solid-State Circuits Conference Digest of Technical Papers, pp. 240-241, p. 352. This prior art is not provided with a high voltage relaxing means.

SUMMARY OF THE INVENTION

An object of the present invention is to provide a highly reliable semiconductor integrated circuit device, whereby the above described problems are resolved and the high voltage applied to a decoupling transistor is relaxed.

The inventive semiconductor integrated circuit device is newly provided with a voltage relaxing means which can relax high voltages applied to a decoupling transistor coupled to a decoder-output portion. Preferably, the voltage relaxing means is inserted between a drain electrode of the decoupling transistor and a gate electrode of the word driver transistor, and is an MOS transistor, wherein a power supply voltage is supplied to the gate electrode of said MOS transistor. By providing said voltage relaxing means, preferably one added transistor, the voltage applied to the decoupling transistor in a conventional device is divided into two parts, that is applied to the voltage relaxing transistor and the decoupling transistor, so that the voltage applied to the decoupling transistor can be relaxed. As a result, a reliable and stable semiconductor integrated circuit device is implemented.

These object and other objects, features, aspects and advantages of the present invention will become more apparent from the following detailed description of the present invention when taken in conjunction with the accompanying drawings.

DESCRIPTION OF THE PREFERRED EMBODIMENTS

An embodiment of the present invention will be described with reference to the drawings.

Figure 3:
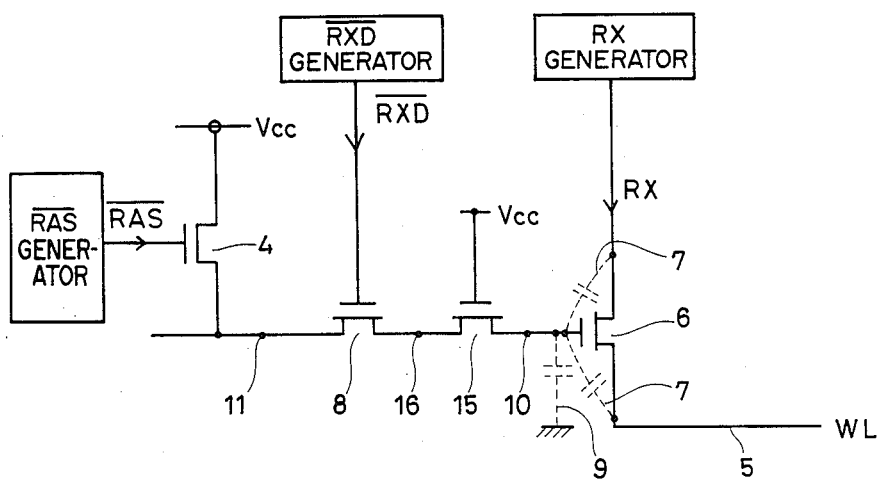
FIG. 3 is a circuit diagram showing an output portion of the row decoder with a voltage relaxing means in accordance with an embodiment of the present invention.

FIG. 3 is a diagram showing the constitution of semiconductor integrated circuit device in an embodiment of the present invention.

FIG. 3 shows an MOS transistor 15, provided for relaxing the voltage accross a decoupling transistor 8, differing from a conventional semiconductor integrated circuit device and within the characteristics of the present invention. One electrode of said transistor 15 is connected to the drain electrode of the decoupling transistor 8 through the node 16. The other electrode thereof is connected to the gate electrode of the word driver transistor 6 through the node 10, and the power voltage Vcc is supplied on the gate electrode. The other parts of said circuit are constituted similarly to those in the circuit shown in FIG. 1, and each corresponding part is designated by the same reference number.

The voltage relaxing operation by the transistor 15, in the semiconductor integrated circuit device constituted as shown in FIG. 3, is further described. By way of example, a description is made of an operation in the case where the word line potential is increased and the "H" level potential for the RX signal is set at 7 V.

Figure 1:
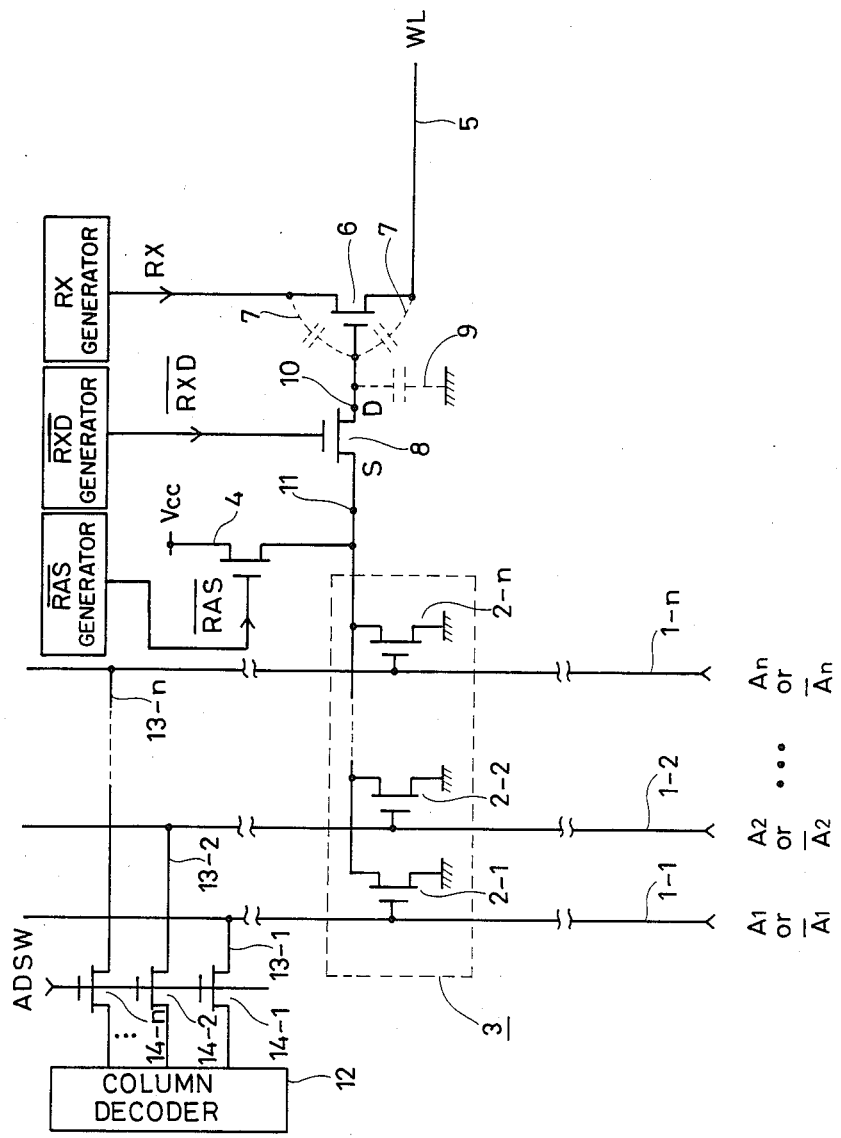
FIG. 1 is a circuit diagram showing a conventional decoder circuit.
Figure 2:
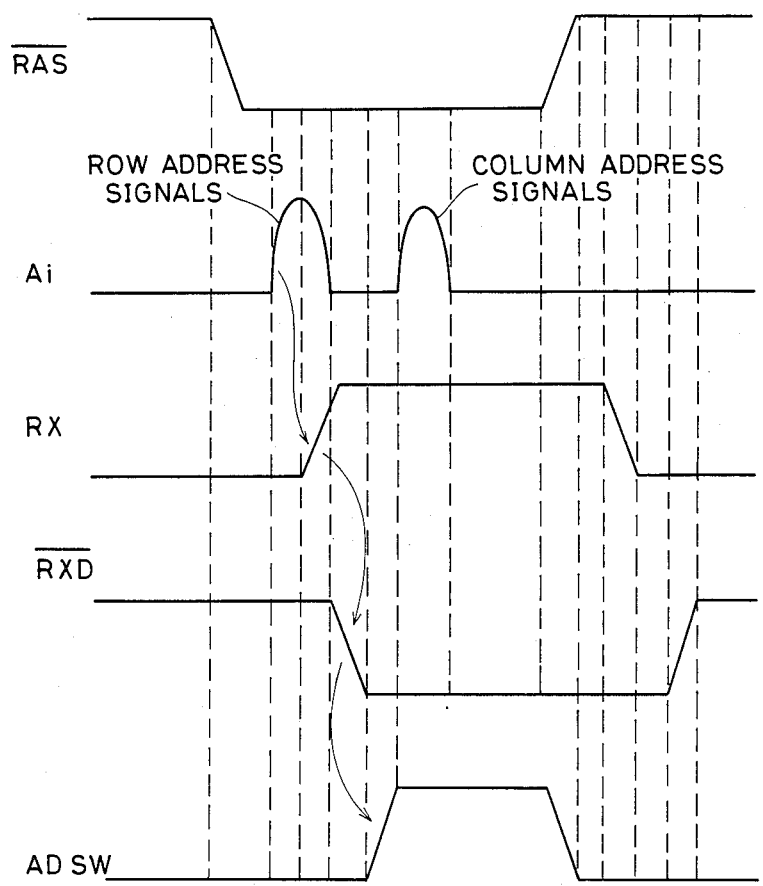
FIG. 2 shows signal waveforms describing the decoder operation.

When the RX signal is supplied (the RX signal is in the "H" level) and the potential at the node 10, increased by capacitive coupling of the gate capacitance 7 in the word driver transistor 6, reaches 10 V, said circuit operates in the same way as a conventional circuit shown in FIG. 1. However, since the gate electrode of the newly added transistor 15 is connected to the power supply (Vcc=5 V), the potential at the node 16 is controlled at 4 V. In the foregoing, the threshold voltage of the transistor 15 is assumed to be 1 V.

Accordingly, at the row decoder in the selected state, the respective potentials for the nodes 10, 16 and 11 become eventually 10 V, 4 V, and 0 V, respectively, and the gate potentials of the transistors 15 and 8 become 5 V and 0 V, respectively.

As a result, the potential across the source (node 11) and the drain (node 16), and across the source and the gate in the decoupling transistor 8, are both suppressed to about 4 V. Moreover, the maximum value of the voltages applied to the transistor 15 is about 6 V across the source and the drain (between the node 10 and node 16), so that the voltages applied to the transistors 8 and 15 are relaxed completely.

In the above described embodiment, the operation at the output portion in the row decoder circuit is represented. The same discussion can be applied to the operation at the output portion in the column-decoder circuit.

As described previously, according to the present invention, a highly reliable semiconductor integrated circuit device can be provided, wherein a relaxing means to relax the voltage applied to the decoupling transistor, preferably one transistor, is arranged so as to relax the high voltage applied to the decoupling transistor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit device for a random access memory including a plurality of memory cells for storing information, comprising:

decoder means for decoding externally applied time multiplexed address signals supplied to said decoder means on address signal lines, said time multiplexed address signals including a row address portion followed by a column address portion, said decoder means having an output portion providing a decoded address signal, said decoder means first receiving said row address portion of said address signals from said address signal lines for designating a row of said memory cells and subsequently receiving said column address portion of said address signals from said address signal lines for designating a column of said plurality of memory cells, an output line coupled to said output portion of said decoder means, a row address strobe signal generator for generating a first operation timing signal, a first transistor coupled to said output line for precharging said output line responsive to said first operation timing signal, a bit line selection timing signal generator for generating a second operation timing signal, a second transistor coupled in series with said output line for transferring a signal on said output line responsive to said second operation timing signal, a memory cell selecting line for selecting any of said memory cells, a word line activating signal generator for generating an activating signal for activating said memory cell selecting line, a third transistor for transferring said activating signal onto said memory cell selecting line responsive to a signal transferred from said second transistor and, voltage suppression means coupled in series with said second transistor for limiting a voltage applied to said second transistor when said second transistor is in an off-state in response to said second operation timing signal.

2. A semiconductor integrate circuit device in accordance with claim 1, wherein said voltage suppression means comprises an MOS transistor having source, drain, and gate electrodes with one of said source and drain electrodes connected to said output portion of said second transistor and the other of said source and drain electrodes connected to said control electrode of said third transistor, and said MOS gate electrode receiving a power supply voltage.

3. A semiconductor integrated circuit device in accordance with claim 1, wherein said voltage suppression means consists essentially of an MOS transistor having source, and gate electrodes with one of said source and drain electrodes connected to said output portion of said second transistor and the other of said source and drain electrodes connected to said control electrode of said third transistor, and said MOS gate electrode receiving a power supply voltage.

4. A semiconductor integrated circuit device in accordance with claim 1, wherein said decoder means is a row address decoder, and said memory cell selecting line is a word line.

5. A semiconductor integrated circuit device in accordance with claim 1, wherein said decoder means is a column address decoder.

6. A method for storing information in a semiconductor random access memory including a plurality of memory cells for storing information, a memory cell selecting line, and a transistor with a control electrode connected to an output line of said memory, said transistor having an on-state and an off-state for selectively transferring information stored in said memory cells to said output line when said transistor is in an on-state, said method comprising the steps of:

generating first and second operating timing signals;

decoding externally applied time multiplexed address signals to output a decoded address signal, said address signals including sequentially applied row address portions and column address portions;

coupling said decoded address signal to said output line;

precharging said output line in response to said first operating timing signal;

transferring an output signal of said memory onto said outline line in response to said second operating timing signal;

generating an activating signal for activating a memory cell selecting line;

transferring said activating signal through said transistor onto said memory cell selecting line in response to said output signal transferred onto said output line; and suppressing a voltage on said control electrode of said transistor when said transistor is in an off-state.

* * * * *